(12) United States Patent
Chen

(10) Patent No.: US 6,507,491 B1
(45) Date of Patent: Jan. 14, 2003

(54) PULL/LATCH TYPE FIXING DEVICE FOR HEAT-RADIATING FIN BODY

(75) Inventor: Wei Chen, Taipei Hsien (TW)

(73) Assignee: Huey Shyang Ent. Co., Ltd., Taipei Hsien (TW)

(*) Notice: Subject to any disclaimer, the term of this patent is extended or adjusted under 35 U.S.C. 154(b) by 0 days.

(21) Appl. No.: 09/983,116

(22) Filed: Oct. 23, 2001

(51) Int. Cl.⁷ ................................................ H05K 7/20
(52) U.S. Cl. .................... 361/697; 26/458; 165/80.3; 165/121; 248/510; 257/719; 257/727; 361/710; 361/719
(58) Field of Search .................. 24/457–458; 165/80.2, 165/80.3, 185, 121–122; 174/16.3; 248/505, 526; 257/718–719, 722, 726–727; 361/687, 690, 695–697, 704, 707, 709–710, 715, 719, 720

(56) References Cited

U.S. PATENT DOCUMENTS

| | | | | |
|---|---|---|---|---|
| 6,049,457 A | * | 4/2000 | Lee | 361/704 |
| 6,061,239 A | * | 5/2000 | Blomquist | 361/704 |
| 6,082,440 A | * | 7/2000 | Clemens et al. | 257/719 |
| 6,181,559 B1 | * | 1/2001 | Seo | 361/704 |
| 6,201,697 B1 | * | 3/2001 | Mccullough | 361/704 |

* cited by examiner

*Primary Examiner*—Gregory Thompson
(74) *Attorney, Agent, or Firm*—Rosenberg, Klein & Lee

(57) ABSTRACT

A pull/latch type fixing device for head-radiating fin body, including a heat-radiating fin body and two fastener units. Two sides of top end of the heat-radiating fin body are respectively formed with two latch grooves. Each fastener unit is inserted in the latch groove, including a locating frame, a latch frame and a pull lever. Two lateral walls downward extend from two ends of the locating frame. The latch frame is bridged between the latch groove and the locating frame. Two latch arms respectively downward extend from two ends of the latch frame. The pull lever is pivotally mounted on the latch frame and has a pair of cam plates. By means of turning the pull lever, the latch arms of the latch frame are biased inward by the lateral walls of the locating frame to tightly hook the latch seat beside the chip.

9 Claims, 7 Drawing Sheets

PULL/LATCH TYPE FIXING DEVICE FOR HEAT-RADIATING FIN BODY

BACKGROUND OF THE INVENTION

1. Field of the Invention

The present invention is related to a pull/latch type fixing device for heat-radiating fin body. By means of turning a pull lever, a latch frame is drivingly pulled upward to tightly latch with a latch seat of a circuit board. The heat-radiating fin body is oppositely pushed downward to make the bottom thereof tightly attach to a chip so as to enhance the heat-radiating efficiency for the chip.

2. Description of the Prior Art

A chip such as a central processing unit (CPU) used in a computer or a servo works at very high frequency. After having activated for a period of time, the chip will heat and have high temperature. In case the heat of the chip is not radiated to lower the temperature, the chip will damage. Conventionally, a heat-radiating fin body is tightly attached to the chip for quickly radiating the heat to outer side. In order easily install the heat-radiating fin body, a latch seat is mounted around the chip of the main board. A fastener is used to tightly latch the heat-radiating fin body on the latch seat with the bottom of the heat-radiating fin body tightly attaching to the chip. The existent fastener is generally made of metal board by punching. Two ends of the fastener are punched to form two latch arms which are directly latched with the latch seat for tightly binding the heat-radiating fin body on the chip. When latched with the latch seat, no stopper member is provided on outer side of the latch arm to stop the latch arm from being outward resiliently stretched by external force. Therefore, when the computer is activated or experienced a falling test, the latch arms of the fastener are very likely to unlatch from the latch seat due to external force. Under such circumstance, the heat-radiating fin body will loosen and drop from the chip.

SUMMARY OF THE INVENTION

It is therefore a primary object of the present invention to provide a pull/latch type fixing device for heat-radiating fin body, including a heat-radiating fin body and at least one fastener unit.

Two sides of top end of the heat-radiating fin body are respectively formed with two latch grooves. The fastener unit includes a locating frame inserted in the latch groove of the heat-radiating fin body. Two ends of the locating frame respectively have two downward extending lateral walls. The fastener unit further includes a latch frame bridged between the latch groove and the locating frame. Two ends of the latch frame respectively have two downward extending latch arms. The latch frame is formed with at least one projecting pivot seat passing through the locating frame. The fastener unit further includes at least one pull lever. A first end of the pull lever is pivotally mounted in the pivot seat of the latch frame. A pair of cam plates upward radially extend from two sides near the first end of the pull lever. The cam plates are pivotally fitted in the pivot seat of the latch frame. In normal state, the cam plates lean against the locating frame, whereby the pull lever can be operated and biased to drivingly pull the latch frame upward and make the latch arms thereof respectively tightly hook in the latch holes of the latch seat. The lateral walls of two ends of the locating frame to hold and clamp outer sides of the latch arms of the latch frame and prevent the latch arms from outward resiliently stretching. The heat-radiating fin body is oppositely downward pressed, whereby the bottom thereof tightly attaches to the chip to enhance the heat-radiating efficiency.

The present invention can be best understood through the following description and accompanying drawings wherein:

DETAILED DESCRIPTION OF THE PREFERRED EMBODIMENT

Figure 1:
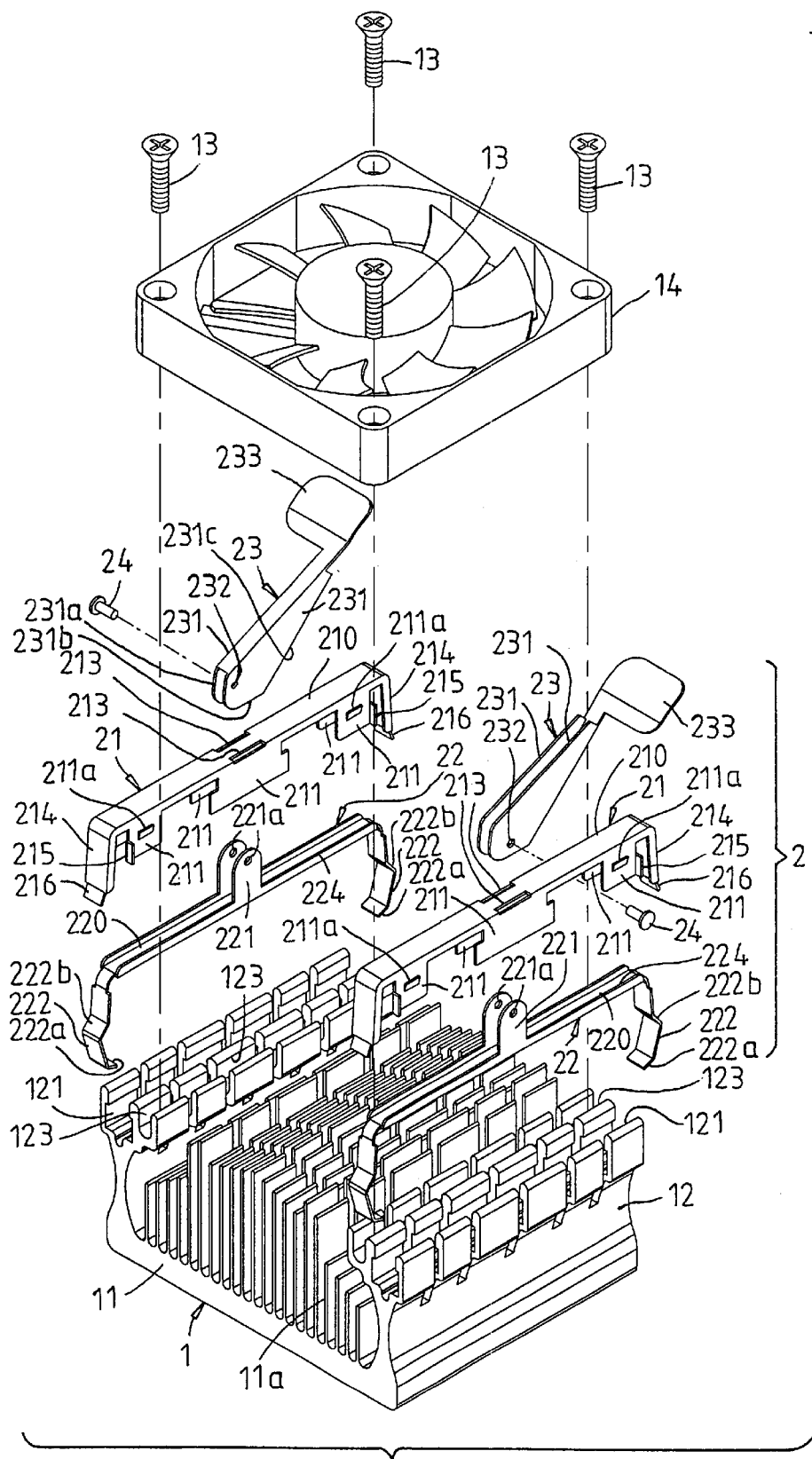
FIG. 1 is a perspective exploded view of the present invention.

Please refer to FIGS. 1 to 5. The fixing device for heat-radiating fin body of the present invention includes a heat-radiating fin body 1 and at least one fastener unit 2. The heat-radiating fin body 1 is overlaid on a chip 4. Two sides of top end of the heat-radiating fin body 1 are respectively formed with two latch grooves 12 1. The fastener unit 2 includes a locating frame 21 inserted in the latch groove 121 of the heat-radiating fin body 1. Two ends of the locating frame 21 respectively have two downward extending lateral walls 214. The fastener unit 2 further includes a latch frame 22 bridged between the latch groove 121 and the locating frame 21. Two ends of the latch frame 22 respectively have two downward extending latch arms 222. In addition, the latch frame 22 is formed with at least one projecting pivot seat 221 passing through the locating frame 21. The fastener unit 2 further includes at least one pull lever 23. A pair of cam plates 231 upward radially extend from two sides near a first end of the pull lever 23. Two sides of the cam plates 231 a r e formed with pivot holes 232. A pivot pin 24 is sequentially passed through the pivot holes 221a of the pivot seats 221 and the pivot holes 232 of the cam plates 231 so as to pivotally mount the pull lever 23 in the pivot seats 221 of the latch frame 22. In normal state, the latch frame 22 itself resiliently outward stretches. The slope sections 222b of two ends of the latch frame 22 are oppositely pushed by bottom edges of lateral walls 214 of the locating frame 21, whereby the cam plates 231 of the pull lever 23 lean against the locating frame 21 in normal state. Accordingly, the handle 233 of the pull lever 23 can be operated and biased to drivingly pull the latch frame 22 upward and make the latch arms 222 thereof respectively tightly hook in the latch holes 31 of a latch seat 3. Under such circumstance, the heat-radiating radiating fin body 1 is downward pressed, whereby the bottom thereof tightly attaches to the chip 4 to enhance the heat-radiating efficiency for the chip 4.

Referring to FIGS. 1 to 5, the heat-radiating fin body 1 of the present invention includes a base board section 11. Two lateral boards 12 respectively upward extend from two sides of the base board section 11. The top end of each lateral board 12 is formed with a latch groove 121. The inner side of the latch groove 121 is formed with a locking groove 123 for screws to screw therein and lock a heat-radiating fan 14 on the heat-radiating fin body 1. Multiple upright heat-radiating fin plates 11a are disposed between the two locking grooves 123 to enhance the heat-radiating efficiency.

Referring to FIGS. 1 to 4, the locating frame 21 of the fastener unit 2 is made of metal board by integral punching. The locating frame 21 includes a body section 210. At least one fixing wing 211 integrally downward extends from a lateral edge of the body section 210. At least one projecting hook section 21 1a is formed on the fixing wing 211 for correspondingly hooking the bottom edge of the latch groove 121 of the heat-radiating fin body 1 and preventing the locating frame 21 from upward departing from the heat-radiating fin body 1. The body section 210 is formed with at least one slot 213 through which the pivot seat 221 of the latch frame 22 upward extends. Two lateral walls 214 respectively downward extend from two ends of the body section 210 to hold and clamp outer sides of the latch arms 222 of two ends of the latch frame 22.

The edges of the body section 210 of the locating frame 21 are further formed with two locating plates 215 for correspondingly holding and clamping two sides of the latch groove 121 of the heat-radiating fin body 1 and preventing the locating frame 2 from transversely sliding on the heat-radiating fin body 1.

The latch frame 22 is made of metal board by integral punching, including a main body 220. At least one pivot seat 221 projects from the main body 220. Two latch arms 222 respectively integrally downward extend from two ends of the main body 220. The free end of each latch arm 222 is inward bent to form a hook section 222a for correspondingly hooking in the latch hole 31 of the latch seat 3.

The middle portion of each latch arm 222 of the latch frame 22 is outward downward bent to form a slope section 222b. When the latch frame 22 is upward pulled by the pull lever 23, the slope sections 222b are oppositely pushed by the bottom edges of the lateral walls 214 of the locating frame 21, whereby the bottom sections of the latch arms 222 are resiliently biased toward the latch seat 3 and the hook sections 222a of the latch arms 222 can be firmly latched in the latch holes 31 of the latch seat 3. In normal state, the slope sections 222b push the lateral walls 214 downward projecting from two ends of the locating frame 21 so as to make the latch frame 22 distal from the locating frame 21 in normal state.

Two guiding inclined boards 216 respectively downward outward extend from free ends of the lateral walls 214 of the locating frame 21. When the latch frame 22 is lifted, the slope sections 222b of the latch arms 222 are guided by the guiding inclined boards 216 to ascend and the latch arms 222 are automatically inward resiliently biased. Accordingly, the hook sections 222a of the latch arms 222 are tightly latched in the latch holes of the latch seat.

Moreover, the main body 220 of the latch frame 22 can be punched with at least one reinforcing rib 224 to increase the strength of the latch frame 22. Accordingly, when upward pulled by the pull lever 23, the latch frame 22 is protected from being bent and deformed.

Figure 2:
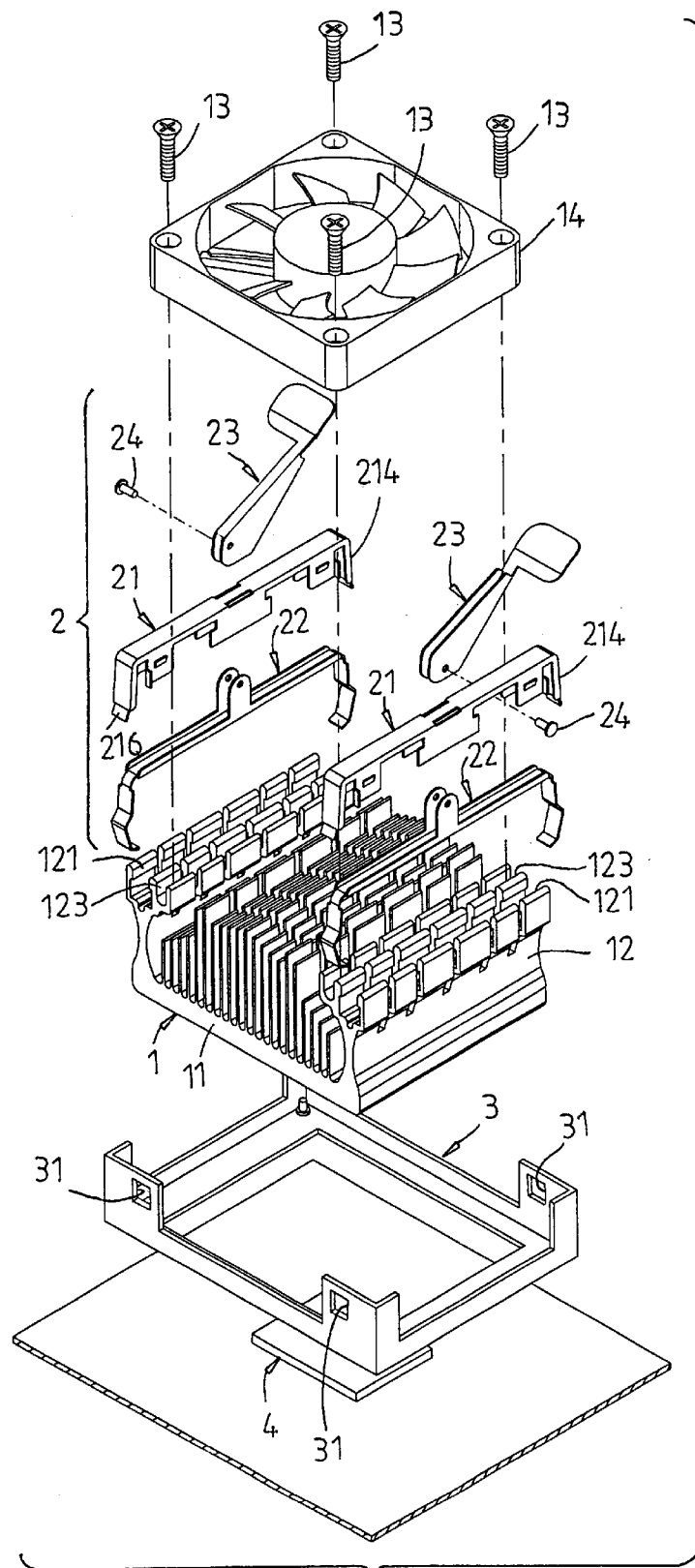
FIG. 2 is a perspective exploded view of the present invention and the latch seat and chip.
Figure 3:
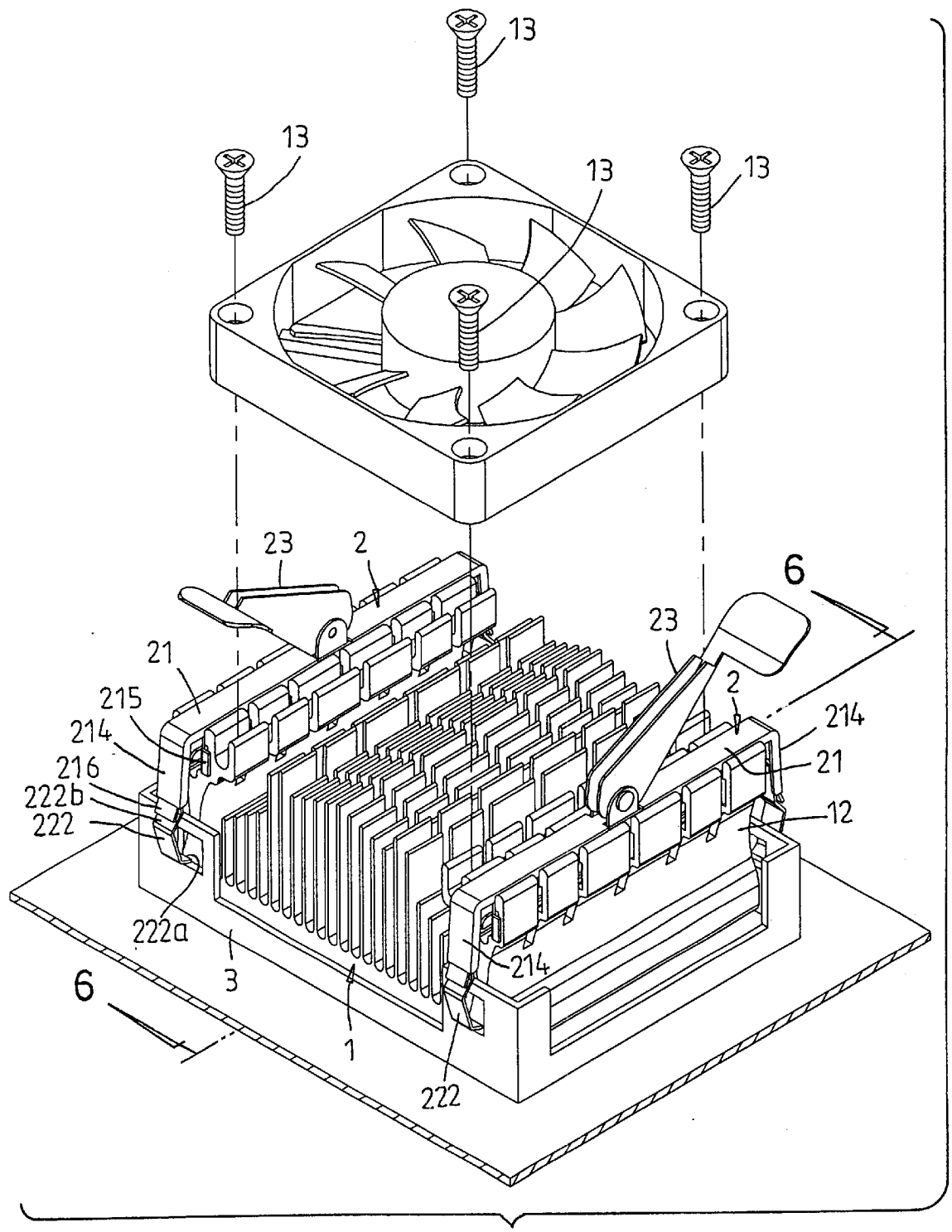
FIG. 3 is a perspective assembled view of the present invention and the latch seat and chip in a not latched state.
Figure 4:
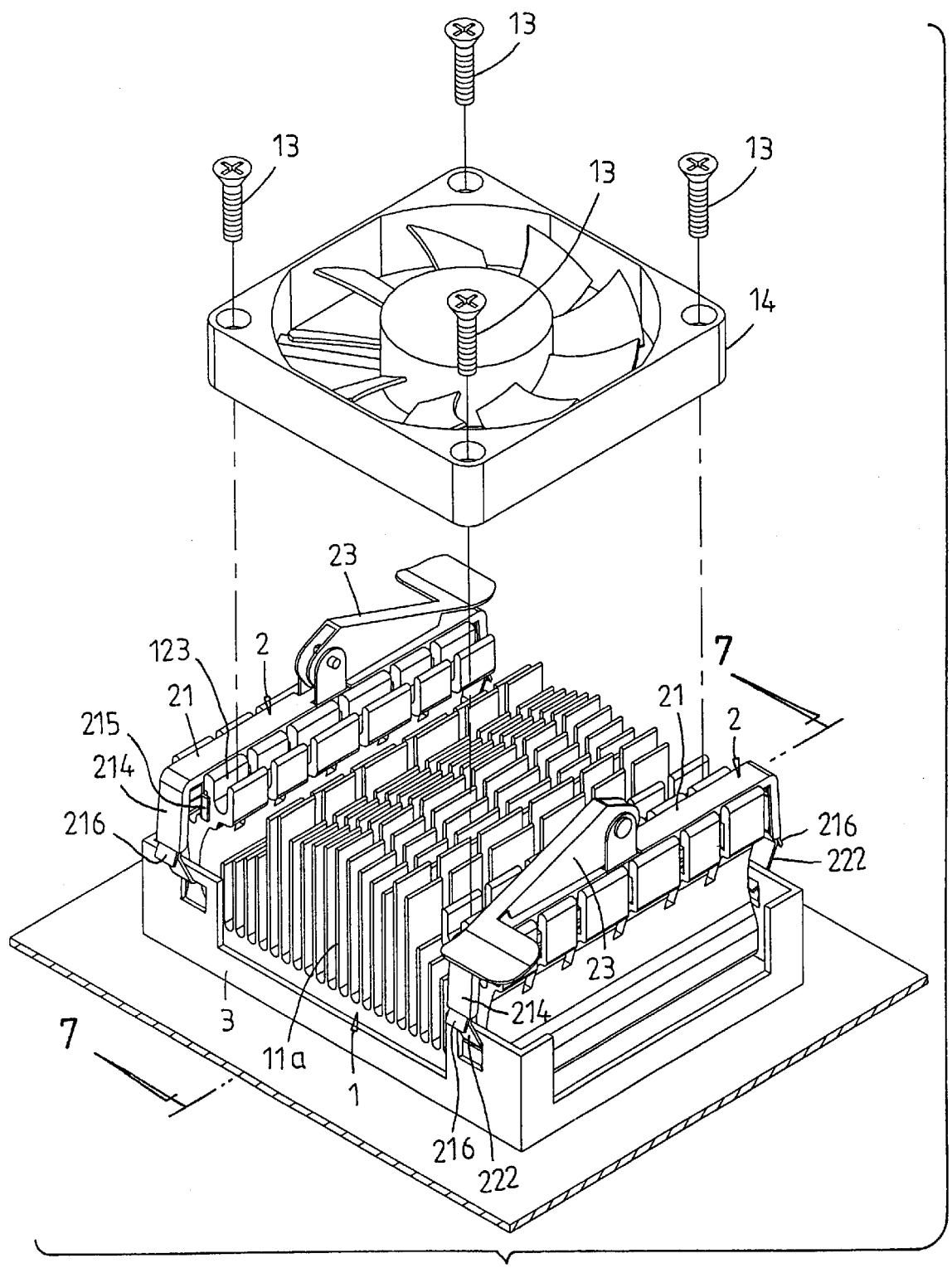
FIG. 4 is a perspective assembled view of the present invention and the latch seat and chip in a latched state.
Figure 5:
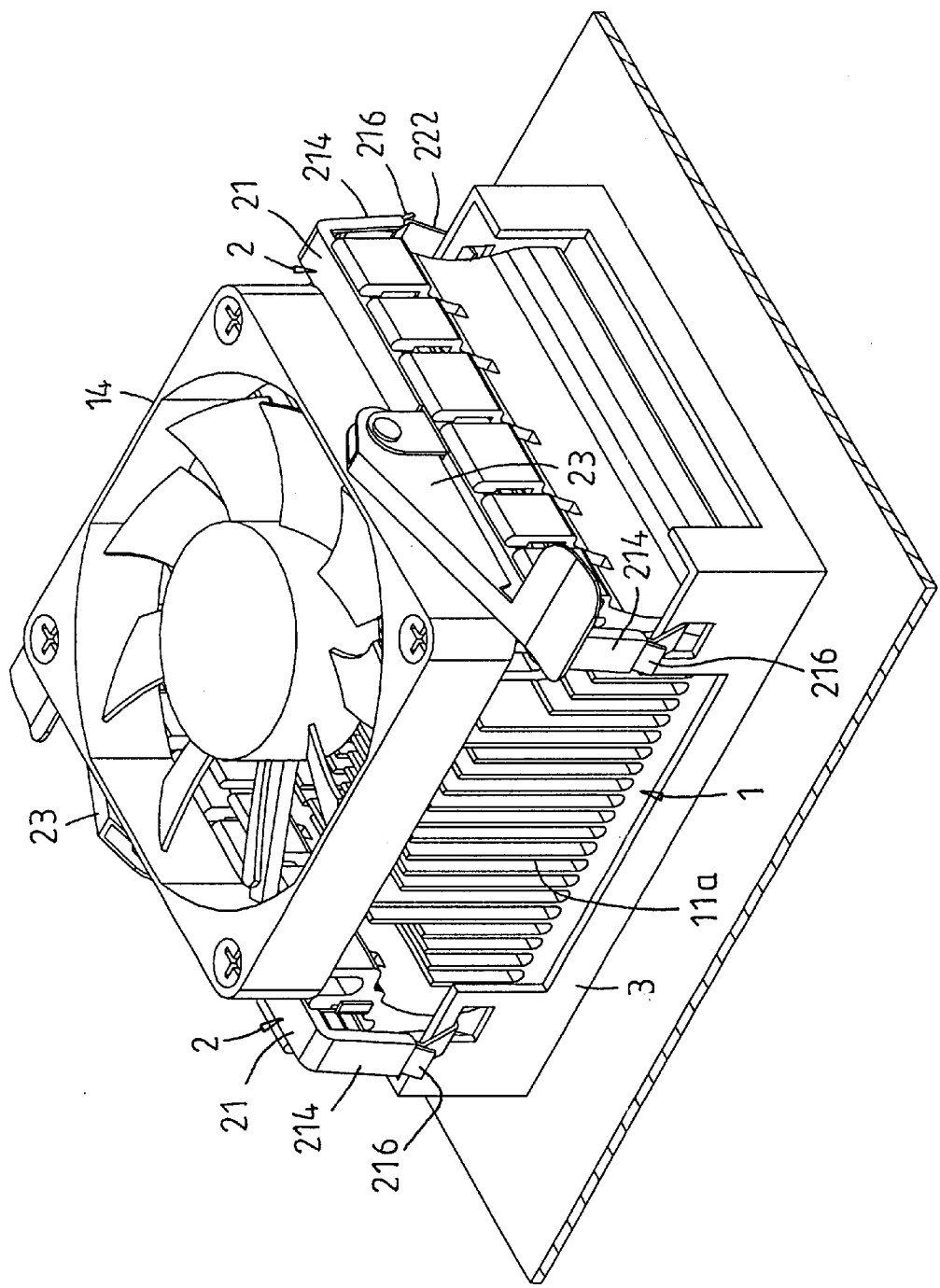
FIG. 5 is a completely assembled view of the present invention.

As shown in FIGS. 1 and 2, a pair of cam plates 231 upward radially extend from two sides near a first end of the pull lever 23. The faces of the cam plates 231 are formed with pivot holes 232. A pivot pin 24 is sequentially passed through the pivot holes 221a of the pivot seats 221 and the pivot holes 232 of the cam plates 231 so as to pivotally mount the pull lever 23 in the pivot seats 221 of the latch frame 22.

The face of each cam plate 231 has a first cam edge 231a, a second cam edge 231b and a third cam edge 231c. The first distance between the first cam edge 231a and the pivot hole 232 is shortest. The second distance between the second cam edge 231b and the pivot hole 232 is longer than the first distance. The third distance between the third cam edge 231c and the pivot hole 232 is longer than the second distance.

Figure 6:
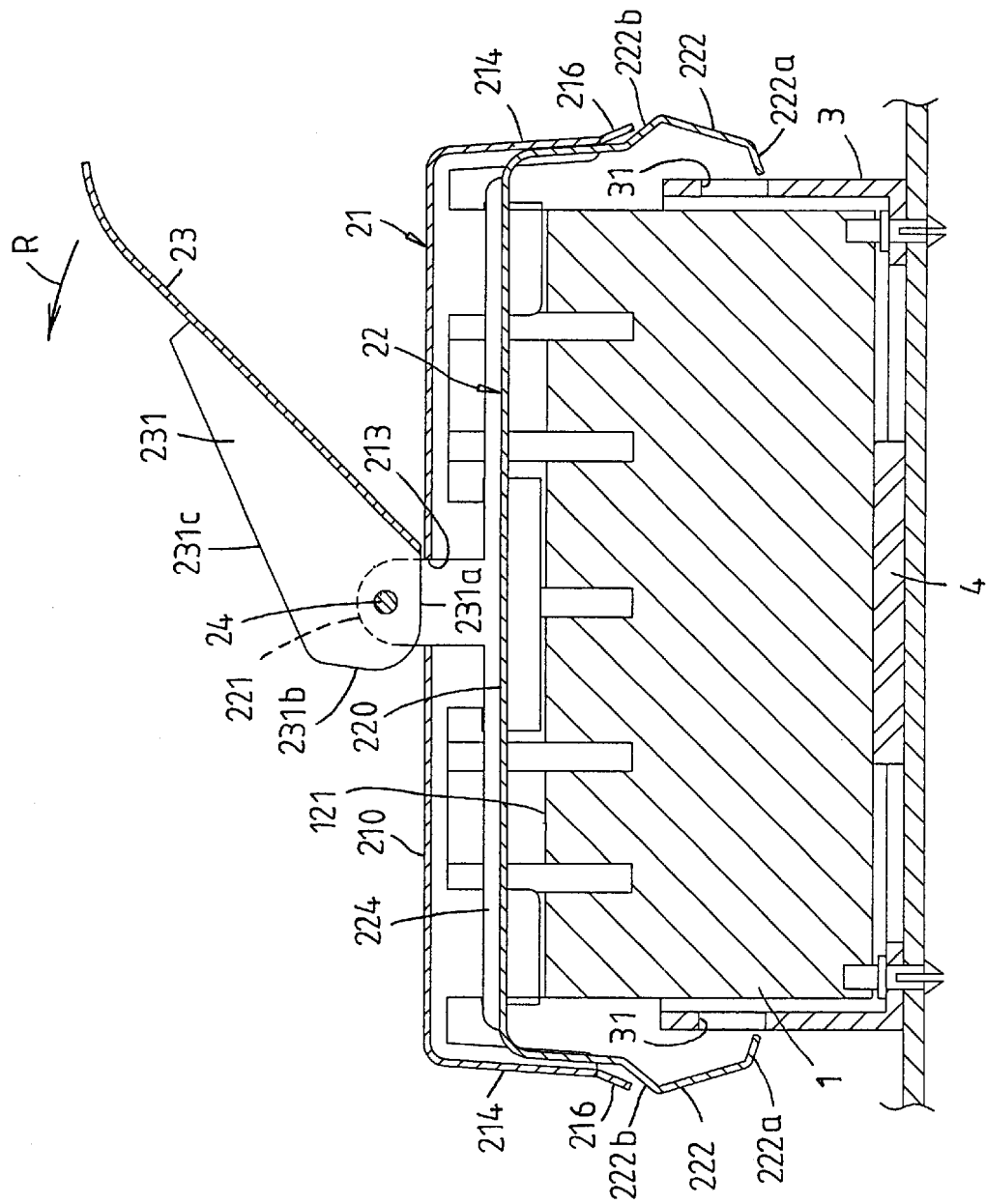
FIG. 6 is a sectional view taken along line 6—6 of FIG. 3.

Referring to FIG. 6, when the first cam edge 231a of the cam plate 231 contacts with the locating frame 21, the distance between the locating frame 21 and the latch frame 22 is longest. The latch frame 22 sinks and the latch arms 222 of two ends of the latch frame 22 are not restricted by the lateral walls 214 of the locating frame 21 and will outward stretch in a totally released state.

When the second cam edge 231b of the cam plate 231 contacts with the locating frame 21, the distance between the locating frame 21 and the latch frame 22 is slightly shorter and the latch frame 22 slightly ascends. The latch arms 222 of the latch frame 22 start to be restricted by the lateral walls 214 of two ends of the locating frame 21 and inward converged to be slightly latched in the latch holes 31 of the latch seat 3 in a temporarily latched state.

Figure 7:
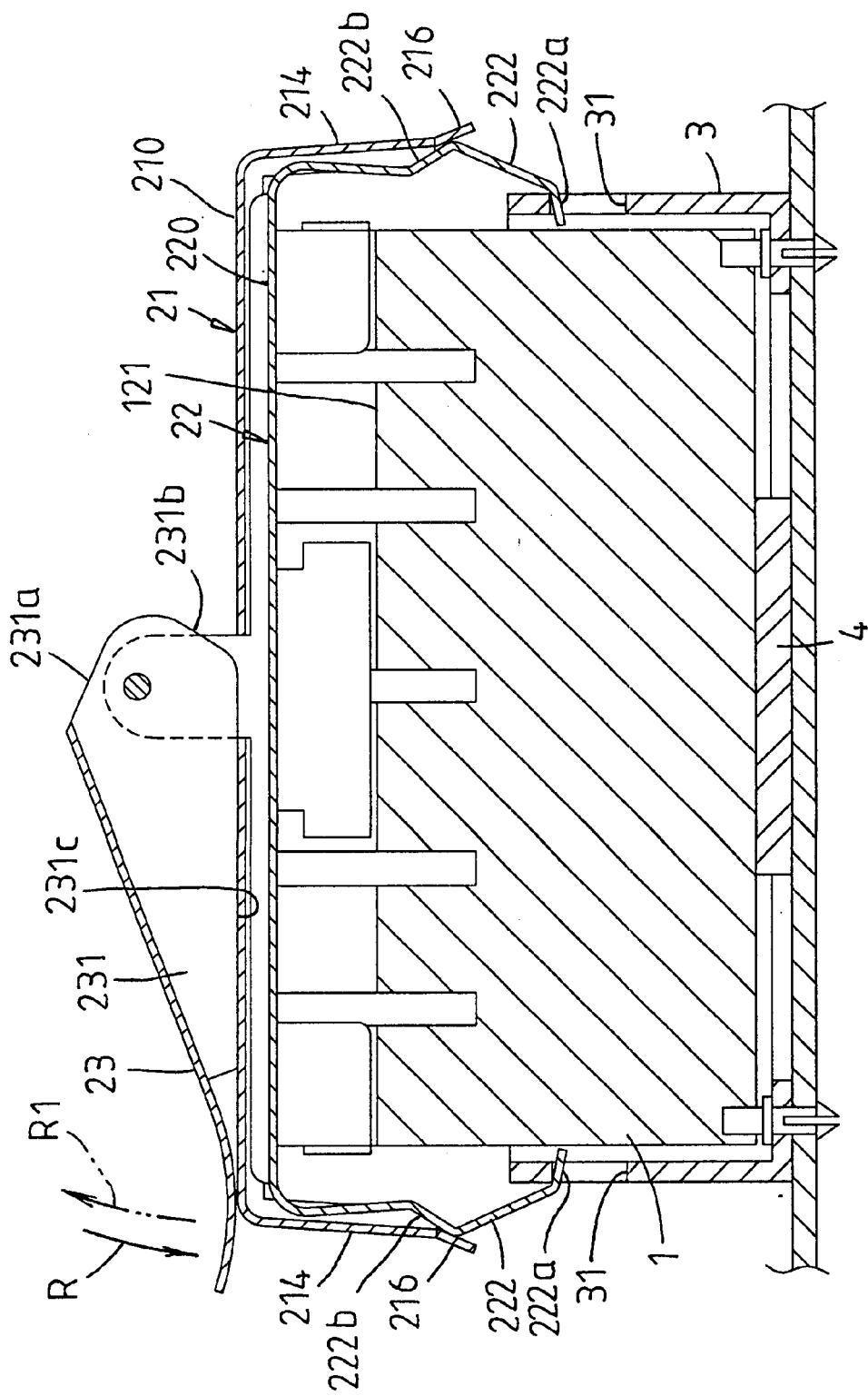
FIG. 7 is a sectional view taken along line 7—7 of FIG. 4.

Referring to FIG. 7, when the third cam edge 231c of the cam plate 231 contacts with the locating frame 21, the distance between the locating frame 21 and the latch frame 22 is shortest and the latch frame 22 ascends to an uppermost position. The latch arms 222 of the latch frame 22 are totally restricted by the lateral walls 214 of two ends of the locating frame 21 and entirely inward converged to be completely latched in the latch holes 31 of the latch seat 3 in a fully firmly latched state.

When assembled, as shown in FIGS. 1 to 5, a fastener unit 2 is mounted on each side of top end of the heat-radiating fin body 1. The bottom end of the heat-radiating fin body 1 is overlaid on a chip 4. At this time, the latch arms 222 of the latch frame 22 are respectively positioned on outer sides of the latch holes 31 of the latch seat 3 as shown in FIG. 6. Under such circumstance, an operator can bias the pull lever 23 in direction R, whereby the cam plate 231 of the first end of the pull lever 23 downward presses the locating frame 21. At this time, the latch frame 22 is reversely pulled upward and the latch arms 222 thereof also ascend along with the latch frame 22. When the slope sections 222b of the latch arms 222 abut against the bottom edges of the lateral walls 214 of the locating frame 21 and are further pulled upward as shown in FIG. 7, the latch arms 222 are oppositely inward resiliently biased by the bottom edges of the lateral walls 214. At this time, the hook sections 222a of the latch arms 222 are pulled upward and tightly latched into the latch holes 31 of the latch seat 3. Accordingly, the heat-radiating fin body 1 is tightly bound over the chip 4.

When it is desired to loosen the heat-radiating fin body 1, the operator can turn the pull lever 23 in direction R1 of FIG. 7, making the cam plate 231 of the pull lever 23 move upward away from the locating frame 21. At this time, the latch arms 222 and slope sections 222b of the latch frame 22 push the bottom edges of the lateral walls 214 of the locating frame 21, whereby the latch arms 222 are moved downward. The hook sections 222a of the latch arms 222 are automatically unlatched from the latch holes 31 of the latch seat 3. Under such circumstance, the operator can detach the heat-radiating fin body 1 from the latch seat 3 for replacing the chip 4.

As shown in FIG. 7, when the hook sections 222a are latched in the latch holes 31 of the latch seat 3, the outer sides of the latch arms 22 are respectively stopped by the lateral walls 214 of the locating frame 21 from being outward biased. Accordingly, the fastener is prevented from detaching from the latch seat due to shock and the computer product can pass the falling test when released. In addition, in use of the present invention, a user only needs to turn the pull lever 23 so that the operation of the present invention is easy. Moreover, the present invention has simple structure and can be easily assembled.

The above embodiment is only used to illustrate the present invention, not intended to limit the scope thereof. Many modifications of the above embodiment can be made without departing from the spirit of the present invention.

What is claimed is:

1. A pull/latch type fixing device for improving heat-radiating capacity of an integrated circuit chip, the pull/latch type fixing device comprising:

(a) a latch seat mounted on a circuit board, the latch seat including a plurality of latch holes formed on a periphery thereof;

(b) a heat-radiating fin body having an upper surface and a lower surface, said heat-radiating fin body being bridged over the latch seat, wherein each of two sides of the upper surface of the heat-radiating fin body has formed thereon a latch groove; and (c) a fastener unit including:

(1) a locating frame inserted in each of the latch grooves of the heat-radiating fin body, wherein each of two ends of the locating frame includes a downward extending lateral wall;

(2) a latch frame mounted between each of the latch grooves and a respective one of the locating frames, wherein each of two ends of each of the latch frames includes a downward extending latch arm, each of the latch frames being formed with at least one projecting pivot seat, the pivot seat passing through a respective one of the locating frames; and (3) at least one pull lever, wherein a first end of the pull lever is pivotally mounted in a respective one of the pivot seats of each of the latch frames, the pull lever including a pair of cam plates extending radially upward from two sides of the first end of the pull lever, the cam plates being pivotally fitted in the pivot seat of the respective one of the latch frames and engaging a respective one of the locating frames, whereby the pull lever is operated to pull the latch frame upward to cause each of the latch arms thereof to engage in a respective one of the latch holes of the latch seat, the heat-radiating fin body being forced oppositely downward, whereby the lower surface of the heat-radiating fin body is firmly applied to the chip to enhance the heat-radiating efficiency thereof.

2. The pull/latch type fixing device as claimed in claim 1, wherein the heat-radiating fin body includes:

a base board section;

two lateral boards respectively extending upward from each of two sides of the base board section, wherein a top end of each lateral board has the latch groove formed thereon;

a locking groove formed adjacent to each of the latch grooves for threading screws therein; and a heat-radiating fan removably attached to the heat-radiating fin body by means of the screws.

3. The pull/latch type fixing device as claimed in claim 1, wherein the locating frame includes:

a body section;

at least one fixing wing integrally formed on and extending downward from a lateral edge of the body section; and at least one projecting hook section being formed on each of the at least one fixing wing for engaging a bottom edge of a corresponding one of the latch grooves of the heat-radiating fin body, wherein the body section has at least one slot formed therein for upwardly extending the pivot seat of the latch frame therethrough.

4. The pull/latch type fixing device as claimed in claim 3, wherein edges of the body section of the locating frame further include at least one locating plate for engaging with at least one lateral end of a corresponding one of the latch grooves of the heat-radiating fin body.

5. The pull/latch type fixing device as claimed in claim 1, each of the latch frames further including a main body, the at least one pivot seat projecting therefrom and each of the two latch arms respectively extending at opposing ends thereof, wherein a free end of each latch arm is inwardly bent to form a hook section for engaging in the respective one of the latch holes of the latch seat.

6. The pull/latch type fixing device as claimed in claim 1, wherein a middle portion of each latch arm of the latch frame is bent outwardly and downward to form a slope section, when the latch frame is upward pulled by the pull lever, each of the slope sections are forced inward by bottom edges of the respective one of the lateral walls of the locating frame when the pull lever is actuated, wherein a free end of each of the latch arms is resiliently biased toward a respective one of the latch holes of the latch seat.

7. The pull/latch type fixing device as claimed in claim 6, the locating frame further including two guiding inclined boards respectively outwardly extending from a free end of each of the lateral walls thereof, such that the slope sections of each of the latch arms are guided inward by the guiding inclined boards and the hook sections of each of the latch arms are tightly engaged in the latch holes of the latch seat when the pull lever is actuated.

8. The pull/latch type fixing device as claimed in claim 5, wherein at least one reinforcing rib is formed on the main body of the latch frame.

9. The pull/latch type fixing device as claimed in claim 1, wherein each cam plate of the pull lever is defined by a first cam edge, a second cam edge and a third cam edge, wherein a first distance is defined between the first cam edge and the pivot hole, a second distance is defined between the second cam edge and the pivot hole, the second distance being greater than the first distance, and a third distance being defined between the third cam edge and the pivot hole, the third distance being greater than the second distance.

\* \* \* \* \*